(12) United States Patent
Shultz et al.

(10) Patent No.: US 11,175,352 B2
(45) Date of Patent: Nov. 16, 2021

(54) AIRCRAFT GROUND POWER PLUG FORCE TESTER

(71) Applicant: Innovative Electrical Design, Inc., Plattsburgh, NY (US)

(72) Inventors: Preston D. Shultz, Woodstock, CT (US); Kevin Crowl, Lewis, NY (US)

(73) Assignee: Innovative Electrical Design, Inc., Plattsburgh, NY (US)

( * ) Notice: Subject to any disclaimer, the term of this patent is extended or adjusted under 35 U.S.C. 154(b) by 0 days.

(21) Appl. No.: 17/054,063

(22) PCT Filed: May 10, 2019

(86) PCT No.: PCT/US2019/031831
§ 371 (c)(1),
(2) Date: Nov. 9, 2020

(87) PCT Pub. No.: WO2019/217896
PCT Pub. Date: Nov. 14, 2019

(65) Prior Publication Data
US 2021/0247464 A1    Aug. 12, 2021

Related U.S. Application Data

(60) Provisional application No. 62/669,717, filed on May 10, 2018.

(51) Int. Cl.
*G01L 5/00* (2006.01)
*G01R 31/69* (2020.01)
(Continued)

(52) U.S. Cl.
CPC ............... *G01R 31/69* (2020.01); *G01L 5/00* (2013.01); *H01R 13/64* (2013.01); *H01R 13/04* (2013.01);
(Continued)

(58) Field of Classification Search
CPC ...... G01R 31/69; H01R 13/64; H01R 13/187; H01R 13/18; H01R 13/11; H01R 13/15;
(Continued)

(56) References Cited

U.S. PATENT DOCUMENTS 6,476,616 B2    11/2002  Yoshida
2013/0323982 A1    12/2013  White

FOREIGN PATENT DOCUMENTS

EP    0257137 A1 *  3/1988  ............ G01M 99/00
EP    0257137 A1    3/1988
(Continued)

OTHER PUBLICATIONS

International Search Report and Written Opinion dated Jul. 19, 2019, in connection with PCT/US2019/031831 filed May 10, 2019.

*Primary Examiner* — Abdullah A Riyami
*Assistant Examiner* — Justin M Kratt
(74) *Attorney, Agent, or Firm* — Downs Rachlin Martin PLLC

(57) ABSTRACT

The present disclosure describes various alternative embodiments of plug force testers, in particular devices well-suited for testing aircraft ground power connection plugs. The disclosed plug force testers provide a fixed, well-supported position for test pins on which a plug is inserted, which can be positioned to correspond to a height or orientation of the pins in an actual aircraft. Embodiments described also may include means for preventing excessive force application during testing.

16 Claims, 8 Drawing Sheets

(51) Int. Cl.
　　 *H01R 13/64* 　　(2006.01)
　　 *H01R 13/04* 　　(2006.01)
　　 *H01R 13/10* 　　(2006.01)
　　 *H01R 13/629* 　　(2006.01)
　　 *H01R 13/15* 　　(2006.01)
　　 *H01R 13/11* 　　(2006.01)
　　 *H01R 13/18* 　　(2006.01)
　　 *H01R 13/187* 　　(2006.01)

(52) U.S. Cl.
　　 CPC .............. *H01R 13/10* (2013.01); *H01R 13/11* (2013.01); *H01R 13/15* (2013.01); *H01R 13/18* (2013.01); *H01R 13/187* (2013.01); *H01R 13/629* (2013.01); *Y10S 439/912* (2013.01); *Y10S 439/913* (2013.01)

(58) Field of Classification Search
　　 CPC ...... H01R 13/629; H01R 13/10; H01R 13/04; G01L 5/00; Y10S 439/913; Y10S 439/912
　　 USPC ......................................... 439/488, 489, 913
　　 See application file for complete search history.

(56) References Cited

FOREIGN PATENT DOCUMENTS

| | | |
|---|---|---|
| JP | 2908008 B2 | 6/1999 |
| KR | 101488890 B1 | 2/2015 |

\* cited by examiner

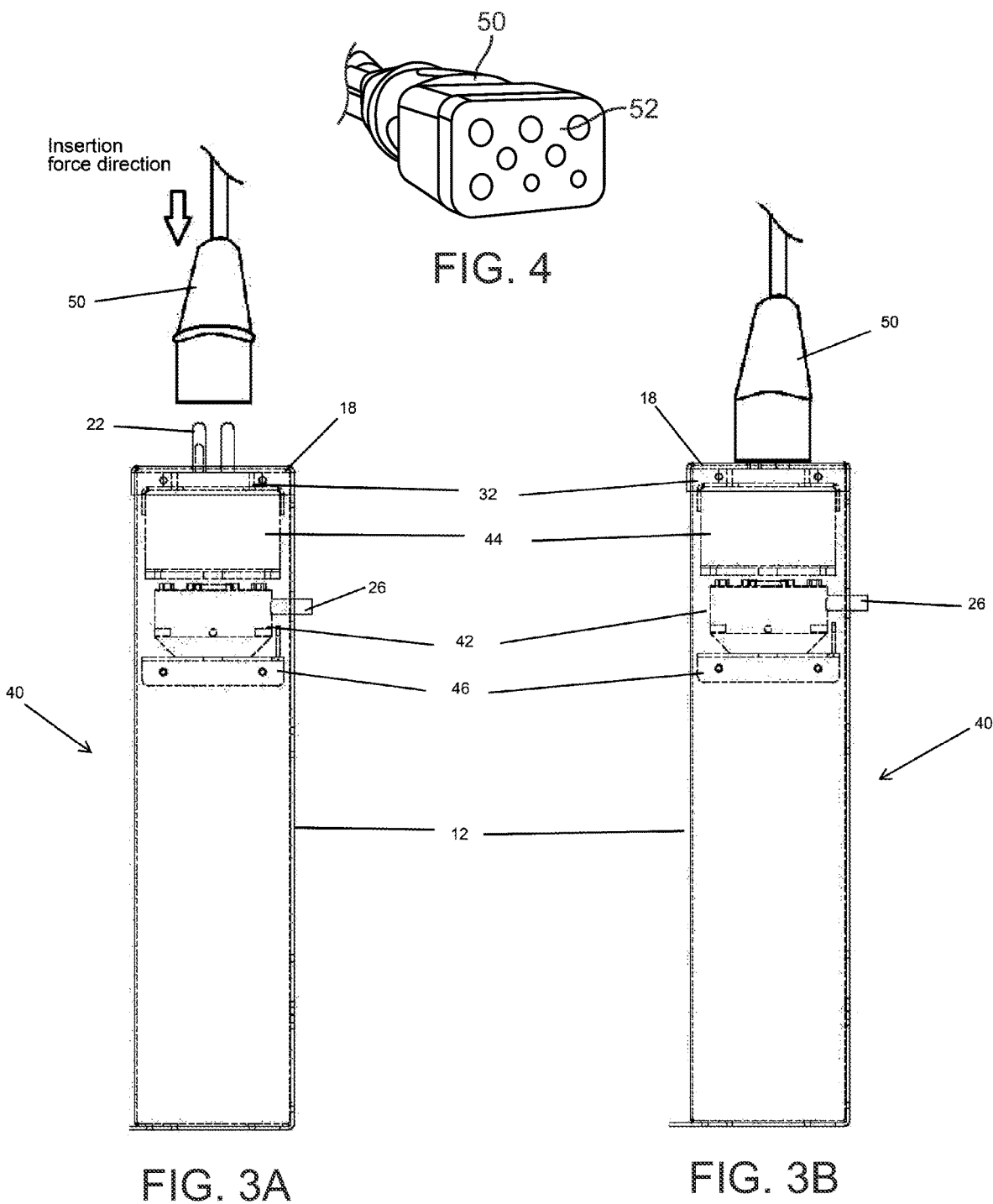

AIRCRAFT GROUND POWER PLUG FORCE TESTER

FIELD OF THE INVENTION

The present invention generally relates to the field of aircraft ground power equipment testing devices. In particular, the present invention is directed to an aircraft ground power plug force tester.

BACKGROUND

Aircraft ground power cable assemblies are used to supply power to an aircraft when it is on the ground with its engines off in situations where it still requires power, for example when a commercial airliner is waiting at the gate for passengers to board. The ground power cable assembly includes a power cable attached at one end to a power supply and provided at the opposite end with a ground power plug configured to mate with a ground power receptacle on the aircraft. In a typical system, the aircraft ground power receptacle is positioned in an accessible region near the bottom of the fuselage and protected by a hinged cover or door. When the cover is opened, receptacle pins are accessible so that the mating ground power plug may be forced into the receptacle in order to complete the ground power connection.

Such ground power cable assemblies and plugs are generally made and maintained according to exacting specifications, along with all other aircraft components. In order to ensure that a complete electrical connection is made and that the plug will not be easily, inadvertently dislodged from the receptacle, there is typically both specified minimum and maximum insertion force requirements for pushing the plug into the receptacle. When insertion force required falls outside the specified limits, it may indicate a problem or defect with the plug. For example, low resistance to insertion may indicate that one or more cylindrical contacts within the plug have been deformed such that they are no longer adequately engaging the receptacle pins. High resistance to pushing in the plug can be caused by corrosion or other defects in the cylindrical contacts inside the openings in the plug face that receives the receptacle pins. It is thus important that reliable measurements of actual insertion force can be made when testing ground power plugs.

Typically, insertion force is measured by mounting a set of dummy receptacle pins on a bench-mounted load cell and then pushing the plug onto the pins. However, for a number of reasons, this typical arrangement is less than satisfactory. For example, the method and position of securing the load cell, such as to a bench, varies depending on the location/facility where the testing is conducted, which can lead to inconsistencies in applied and measured forces. As another example, the person conducting the test must be careful not to overload the load cell when pushing the plug onto the pins by pushing past a point where the pins are fully seated within the plug. This can lead to overestimation of the actual force needed to properly seat the plug.

SUMMARY

Disclosed herein is an apparatus for testing connection and removal force in electrical connectors, in particular in aircraft ground power plugs. In one embodiment, such an apparatus may include a support structure that defines a positive stop to limit travel of the electrical connector plug being tested. Test pins are provided corresponding to the pins of the receptacle of the connector plug to be tested. The test pins extend beyond the positive stop. A force sensor is disposed on the support structure and configured to measure force applied to the test pins when an electrical connector plug is placed on or removed from the test pins. The structure and positive stop is configured and positioned relative to the test pins so as to limit application of force to the force sensor when the connecter plug being tested is fully seated on the test pins.

In a further aspect of the present disclosure, a method for testing connection and removal force in electrical connectors and connector plugs may include steps of pushing the electrical connector plug onto a set of test pins wherein the test pins are mounted to a force sensor, fully seating the electrical connector plug on the test pins, preventing application of force to the test pins through the electrical connector plug after the electrical connector plug is fully seated on the test pins, and measuring, with the force sensor, the force required to fully seat the electrical connector plug on the test pins. Further steps may include removing the electrical connector plug from the test pins, and measuring, with the force sensor, the force required to remove the electrical connector plug from the test pins. Additionally, the preventing of application of force may be performed by positioning a physical stop to limit travel of the electrical connector plug when fully seated on the test pins.

Another embodiment disclosed herein is an apparatus for testing connection and removal force in an aircraft ground power connector plug. In this embodiment a support structure defines a housing and a force sensor is mounted within the housing. Test pins are mounted on a pin plate with the pin plate mounted in the housing and configured to transfer force applied to the test pins to the force sensor. A cover plate defines pin holes mounted above the force sensor with the test pins extending through the pin holes. The cover plate is also positioned relative to the test pins to limit force application to the test pins by an aircraft ground power connector plug when fully seated on the test pins. Further features disclosed may include the cover plate defining a positive stop that limits travel in a connection direction of the plug being tested when the plug is fully seated on the test pins. Another disclosed feature includes the test pins extending beyond the cover plate by a distance substantially the same as pin length of an in-service receptacle of the same type.

Also disclosed herein are test pin assemblies for use with test apparatus as described. Such test pin assemblies may comprise test pins mounted on a pin plate in a specific pin configuration corresponding to a specific connector plug for which the test apparatus is to be used. Specific connector plug may include, among others, one or more of a 400 Hertz aircraft ground power connector plug, a 270 VDC aircraft ground power connector plug and a 28.5 VDC aircraft ground power connector plug.

Components of apparatus described in the present disclosure also may be provided in kit form. For example, such a kit may include a test pin assembly as mentioned in the preceding paragraph and a cover plate for the support for the test apparatus, which includes holes corresponding to the arrangement of the test pins in the test pin assembly to permit the test pins to pass therethrough and extend beyond the cover plate a distance substantially equal to the pin length in a corresponding specific aircraft ground power receptacle. The cover plate in the kit may also provide the positive stop for the apparatus to limit travel of a connector plug when fully seated on test pins. A further part which may be included in such a kit is a pin guide mounted mountable to or mounted on the cover plate. The pin guide included would be configured to match the shape and size of a pin guide in the corresponding specific aircraft ground power receptacle.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIGS. 3A and 3B are cross-sectional views of another alternative embodiment of a power plug force tester according to the present disclosure, shown with test positions of a 400 Hertz aircraft ground power plug;

FIG. 4 illustrates an example of a 400 Hertz aircraft ground power plug;

DETAILED DESCRIPTION

The present disclosure describes various alternative embodiments of power plug force testers, in particular embodiments well-suited for testing of aircraft ground power plugs. The disclosed plug force testers provide a fixed, well-supported position for test pins on which a plug is inserted, which can be positioned to correspond to a height or orientation of the pins in an actual aircraft. Embodiments described also may include means for preventing excessive force application during testing.

Figure 1:
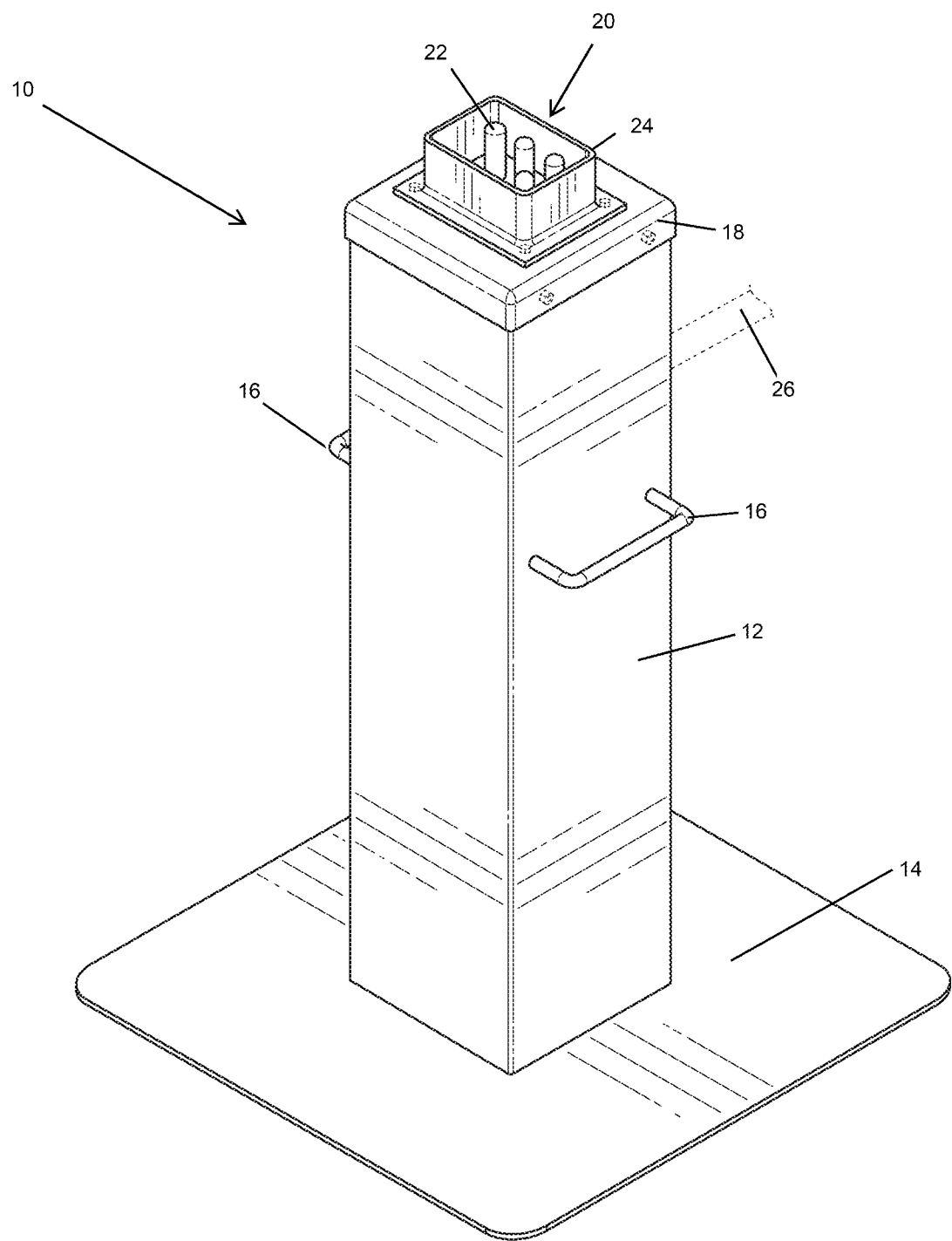
FIG. 1 is a perspective view of one embodiment of an aircraft ground power plug tester as disclosed herein, with test pins adapted for a standard 400 Hertz aircraft ground power plug.

In one embodiment, as shown, for example in FIG. 1, an aircraft ground power plug force tester 10 according to the present disclosure includes a housing 12 mounted on a base 14. Handles 16 may be provided for convenient positioning and relocation of the tester 10. Materials may comprise mild steel plate or sheet metal of various thicknesses as may be determined by persons of ordinary skill. The housing 12 is topped with a cover plate 18 that provides for mounting of a test pin assembly 20. The test pin assembly 20 in this embodiment includes test pins 22 that match the pins used in common 400 Hertz aircraft ground power receptacles in the field, on which a plug to be tested would normally be engaged. Test pin assembly 20 includes pin plate 32 (see FIG. 2) on which the test pins are mounted. Test pin assembly 20 also may include a plug guide or shroud 24 surrounding test pins 22 corresponding to the pin hole arrangement of the ground power plug to be tested. Cover plate 18 includes holes or openings corresponding to the arrangement of test pins 22 in test pin assembly 20. A power and communication cable 26 connects an internal force sensor (see FIGS. 2, 3A and 3B) with a user interface, such as a PC, laptop or other appropriate smart interface (not shown). Further external views of embodiments of aircraft ground power plug force testers are shown in FIGS. 4, 5, 6 and 7.

Figure 2:
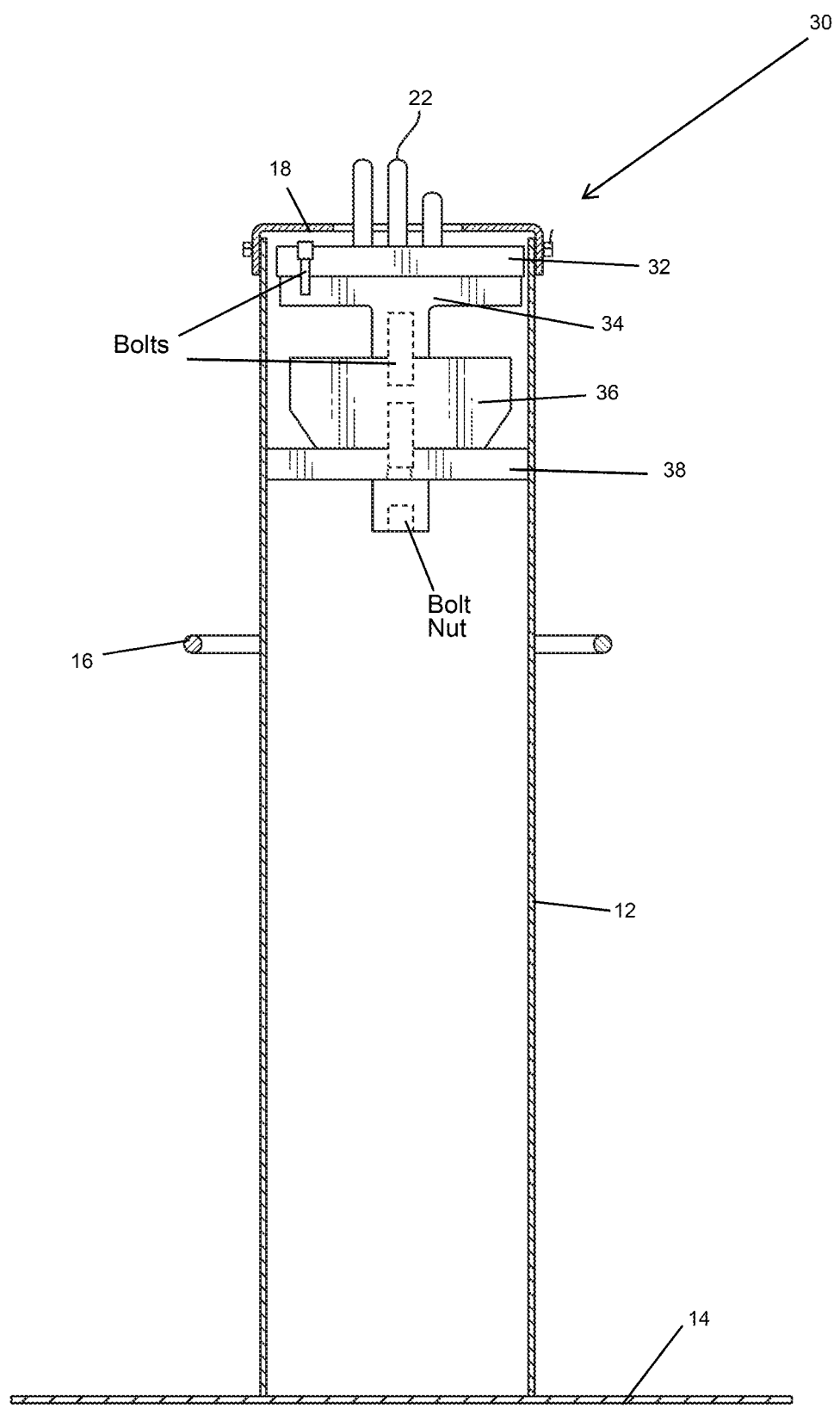
FIG. 2 is a cross-sectional view of one alternative embodiment of an aircraft ground power plug force tester, with test pins adapted for a standard 400 Hertz aircraft ground power plug.
Figure 5:
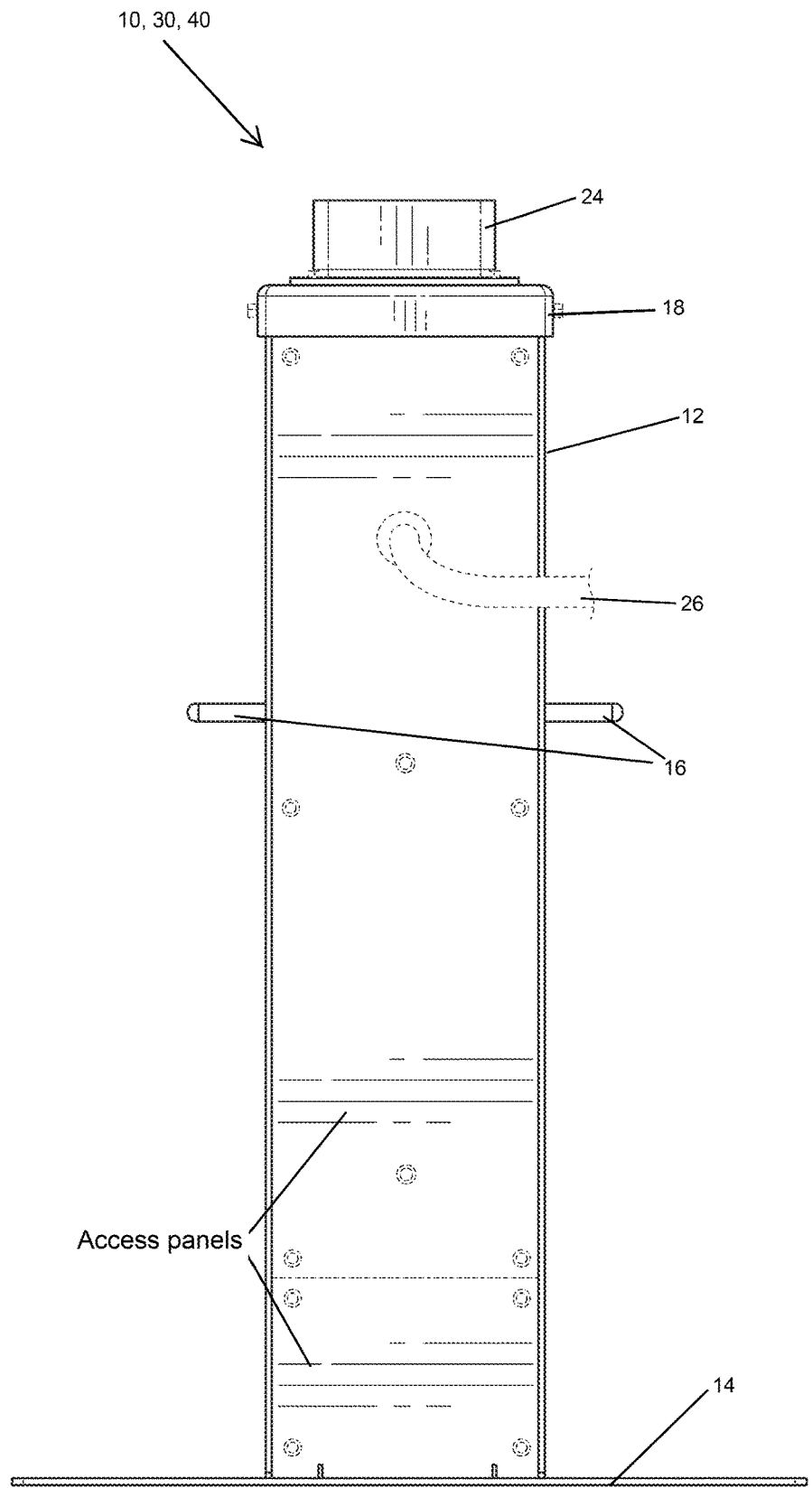
FIGS. 5 and 6 are alternate side elevational views of an embodiment of an aircraft ground power plug force tester.
Figure 6:
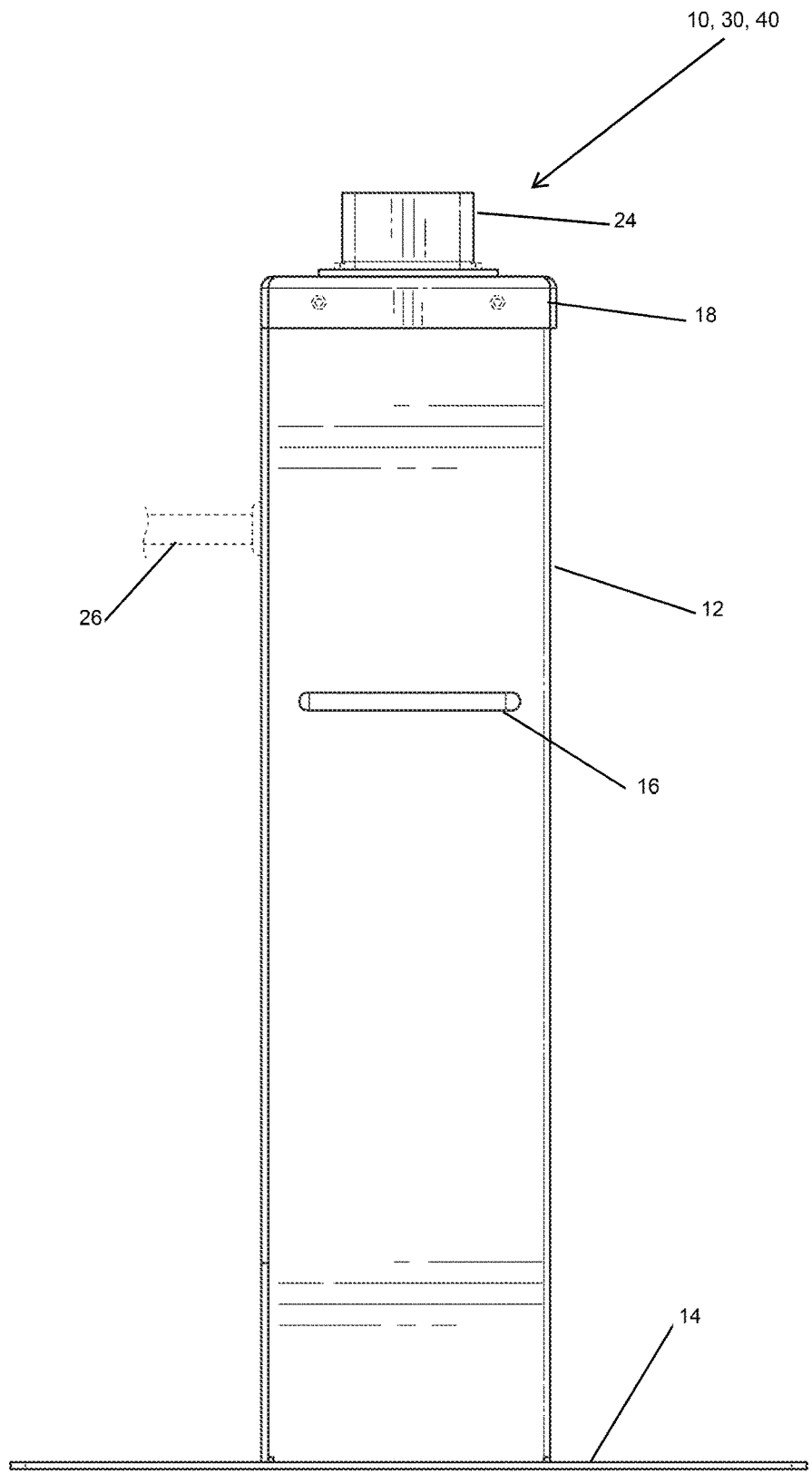
Figure 7:
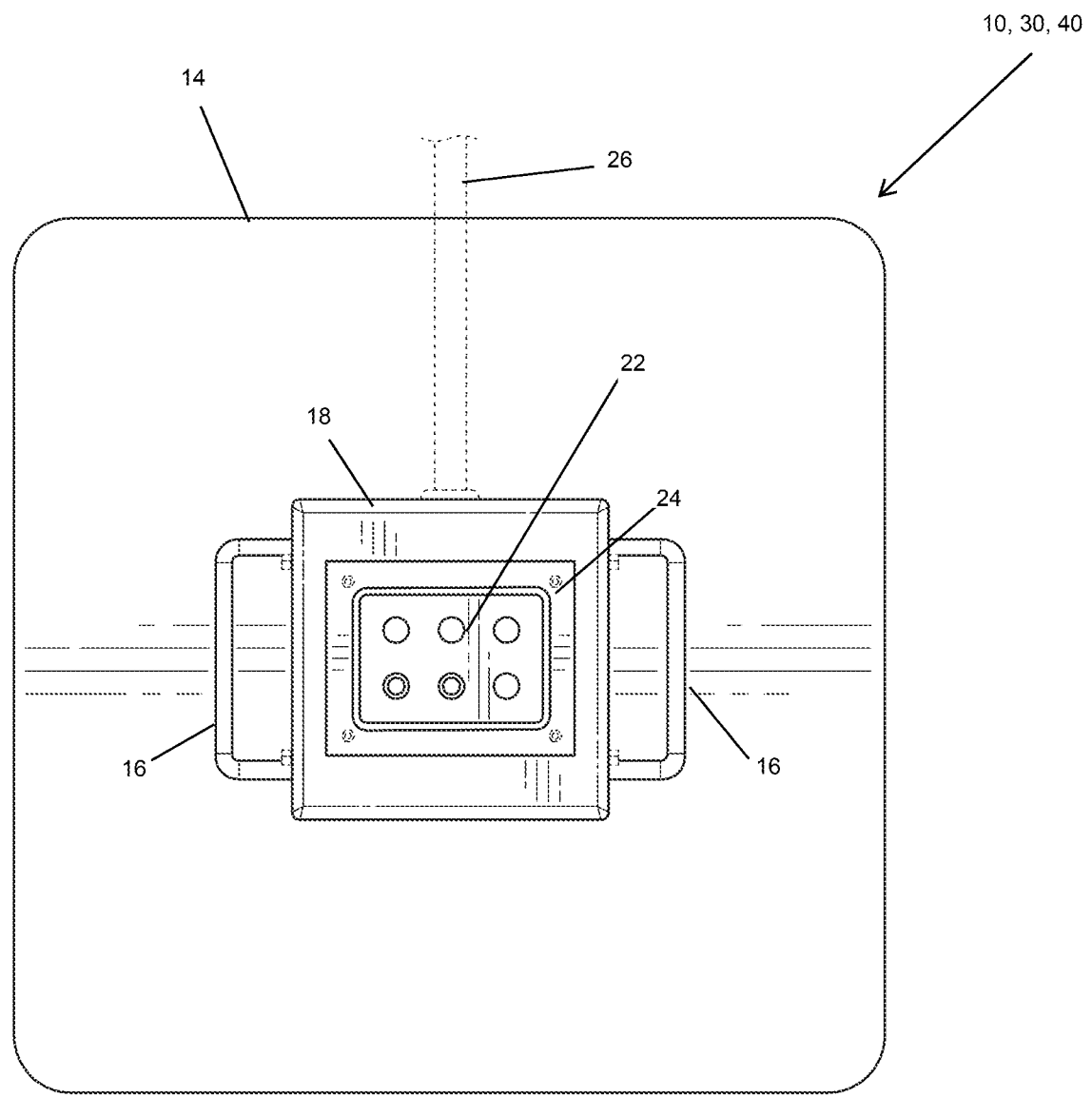
FIG. 7 is a top plan view of an another embodiment of an aircraft ground power plug force tester.
Figures 8A, 8B:
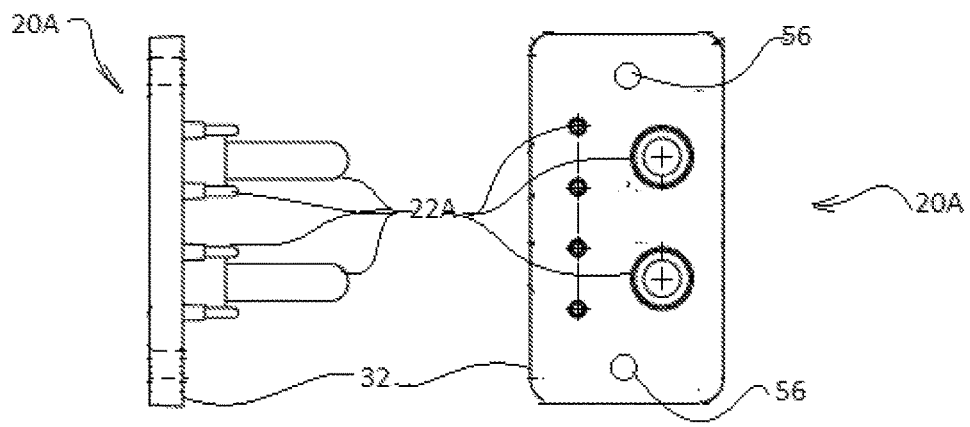
FIGS. 8A and 8B are, respectively, side and top views of a test pin set adapted for a standard 270 VDC aircraft ground power plug.
Figures 9A, 9B:
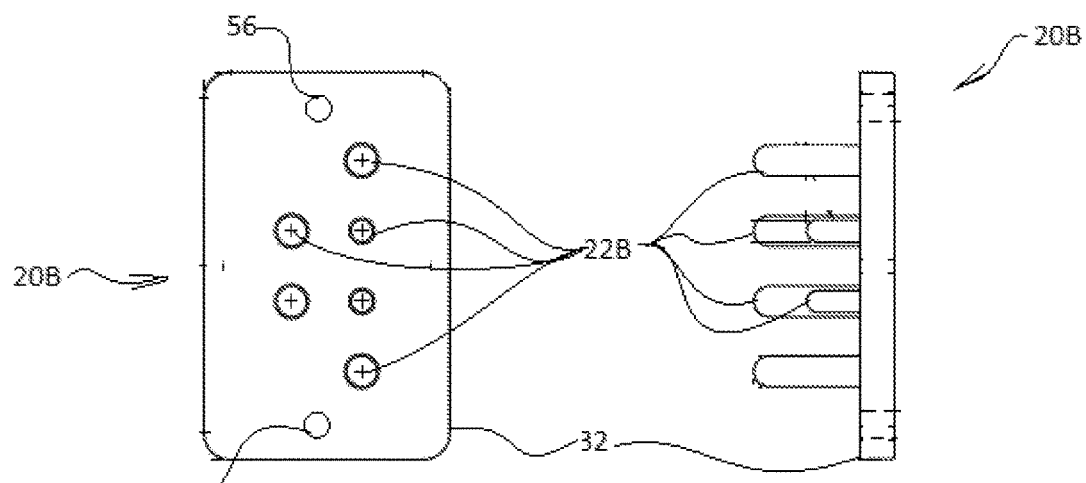
FIGS. 9A and 9B are, respectively, side and top views of a test pin set adapted for an alternative 400 Hertz aircraft ground power plug.
Figures 10A, 10B:
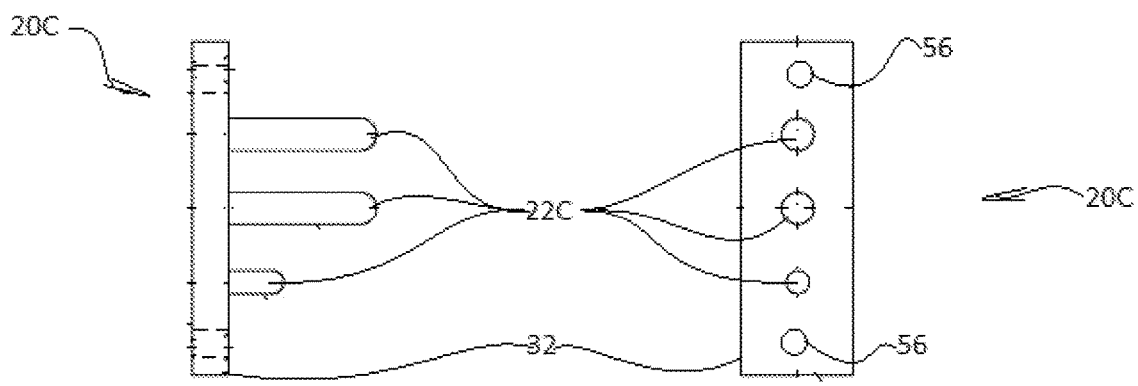
FIGS. 10A and 10B are, respectively, side and top views of a test pin set adapted for a standard 28.5 VDC aircraft ground power plug.

FIG. 2 further illustrates one example of an internal arrangement of a power plug force tester 30 according to the present disclosure. In this embodiment, the test pins 22 are mounted on a pin plate 32 that is in turn bolted to an adapter 34 configured to mate with the force sensor 36. The force sensor 36 is mounted on a rigid floor member 38, which may be a steel plate welded to the inside of the housing walls 12. A nut and bolt arrangement (not shown) extending up through the floor engages and secures the force sensor. In one illustrative embodiment, the force sensor 36 may comprise a load cell or low-profile load cell with sufficient force capacity for the anticipated test loads. Persons of ordinary skill in the art may select appropriate force sensors according to specific anticipated loads and other use conditions.

Use of power plug force testers according to the present disclosure is described with reference to FIGS. 3A and B showing use with a 400 Hertz aircraft ground power plug, and which also illustrate an alternative plug force tester embodiment 40. In the FIGS. 3A-B alternative embodiment, the test pins 22 are again mounted to a pin plate 32. The test pins 22 extend through openings in the cover plate 18 so that when force is applied to pins 22 in the downward or upward direction (downward direction indicated by the arrow in FIG. 3A) as the plug is placed on or removed from pins 22, the force is transferred to and measured by force sensor 42. Pins 22 may be mounted to the force sensor via pin plate 32 which is attached to the force sensor 42. This may be accomplished, for example, by directly mounting the pin plate on the sensor portion of the force sensor 42, or by using an intervening adapter structure 44 as shown. Force sensor 42 is mounted on an internal floor member 46 secured to the walls of housing 12.

Figure 11:
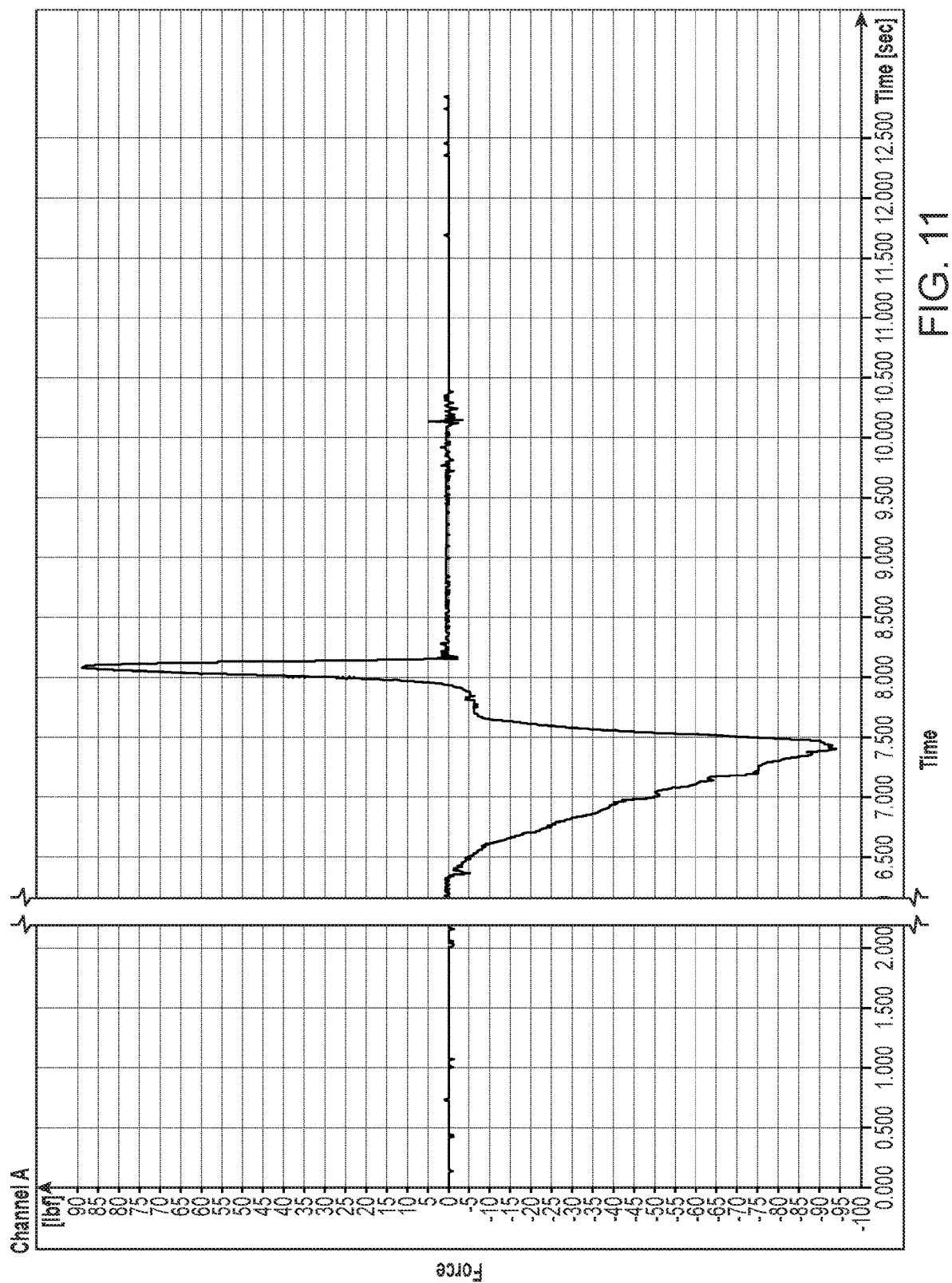
FIG. 11 is an example of a force-time plot produced by testing of an aircraft ground power plug using an embodiment of a tester disclosed herein.

Plug insertion force is tested by pushing the plug 50 (see, e.g., FIG. 4) down onto the test pins (as indicated by the arrow in FIG. 3A) in the same way that a plug would be pushed onto an actual receptacle, whether in an aircraft or other application. When the plug first contacts the test pins 22, they are pushed down against the force sensor (acting through the pin plate and adapter structure, if used). As additional force is applied to force the plug onto the pins, the additional force is transferred to force sensor 42. The profile of the force necessary to first push the plug onto the test pins and then pull it off can be recorded in a force vs. time plot as shown in FIG. 11.

In order to more accurately simulate real world conditions, the test apparatus should prevent force from being applied to the pins 22 once the plug is fully seated thereon. In order to effectively simulate this condition, the cover plate 18 is configured as a positive stop that cannot be overcome by additional force and thus limits the amount of force that can be applied to the force sensor. The test pins, riding on the force sensor extend upwardly through holes in the cover plate by a distance that may be substantially the same as the length of the pins normal pin/plug assembly so that the distance of travel when the plug is pushed onto the pins is substantially the same as in normal pin/plug assembly. When a plug is pushed all the way onto the pins, plug face 52 (FIG. 4) will come in contact with the cover plate surface, thus preventing further application of force onto the force sensor. This arrangement not only limits force application to simulate real world conditions but also helps prevent damage to the plug, plug face or cylindrical contacts within the plug face openings due to excessive force applied during testing.

In one example, a ground power plug 50 for a 400 Hz cable assembly, having plug face 52, as shown in FIG. 4, might require a force for insertion or removal in the range of about 60 lbs. to about 200 lbs. In this example, the force sensor and the housing and other supporting structures should be selected and configured to accommodate force applications in excess of 200 lbs., for example up to the force limit of the force sensor, which may be for some device in the range of about 1250 lbs. Other size and shape plugs may have other force specifications. However, regardless of the plug type, pin configuration or force insertion/removal specifications, a configuration comprising test pins mounted on a force sensor structure and extending through a cover plate forming a positive limit of travel stop substantially as shown in the present figures may be employed.

Alternative test pin assemblies 20A, 20B and 20C are shown in FIGS. 8A and 8B, FIGS. 9A and 9B, and FIGS. 10A and 10B, respectively. Each alternative test pin assembly includes test pins 22A, 22B, or 22C, respectively, mounted on pin plate 32. Each set of test pins is arranged to match the arrangement of pins in the corresponding functional connector assemblies, for example, a standard 270 VDC connector assembly, an alternative 400 Hertz aircraft ground power connector assembly used in some military applications, and/or a standard 28.5 VDC power connector assembly as illustrated in FIGS. 8A through 10B.

Providing different test pin assemblies matched to different connector types allows a single test apparatus (e.g. 10, 30, 40) to be used to test many plugs of many different connector types. By use of a common pin plate interface, pin plate 32 for each different test pin configuration may be attached, such as by bolts or screws, to adapter plate 34, 44. Holes 56 are provided in pin plates 32 for this purpose as one means of attachment. Kits for testing different connector types also may be provided comprising an appropriate pin plate assembly and a cover plate 18 with opening matched to the specific test pin arrangement of the designated connector. Cover plate 18 when provided in kit form also may have a specifically shaped plug guide 24 matched to the outside profile of the plug of the designated connector for the specific kit. Such kits may be provided in a package with a test apparatus or as separate, after-market accessories.

The foregoing has been a detailed description of illustrative embodiments of the invention. It is noted that in the present specification and claims appended hereto, conjunctive language such as is used in the phrases "at least one of X, Y and Z" and "one or more of X, Y, and Z," unless specifically stated or indicated otherwise, shall be taken to mean that each item in the conjunctive list can be present in any number exclusive of every other item in the list or in any number in combination with any or all other item(s) in the conjunctive list, each of which may also be present in any number. Applying this general rule, the conjunctive phrases in the foregoing examples in which the conjunctive list consists of X, Y, and Z shall each encompass: one or more of X; one or more of Y; one or more of Z; one or more of X and one or more of Y; one or more of Y and one or more of Z; one or more of X and one or more of Z; and one or more of X, one or more of Y and one or more of Z.

Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An apparatus for testing connection and removal force in an aircraft ground power connector plug, comprising:
   a support structure defining a housing;
   a force sensor mounted within the housing;
   test pins mounted on a pin plate, the pin plate being mounted in the housing and configured to transfer force applied to the test pins to the force sensor; and
   a cover plate defining pin holes mounted above the force sensor with said test pins extending through the pin holes, the cover plate positioned relative to the test pins to limit force application to the test pins by an aircraft ground power connector plug when fully seated on the test pins.

2. The apparatus of claim 1, for testing connection and removal force in an aircraft ground power connector plug, wherein said cover plate defines a positive stop that limits travel in a connection direction of the plug being tested when the plug is fully seated on the test pins.

3. The apparatus of claim 1, for testing connection and removal force in an aircraft ground power connector plug, wherein the test pins extend beyond the cover plate by a distance substantially the same as pin length of an in-service receptacle of the same type.

4. The apparatus of claim 1, for testing connection and removal force in an aircraft ground power connector plug, further comprising a pin guide mounted on the cover plate and surrounding the test pins, wherein the pin guide is configured to match the shape and size of a pin guide in a non-test aircraft ground power connector receptacle.

5. The apparatus of claim 1, for testing connection and removal force in an aircraft ground power connector plug, wherein said support structure is configured to accommodate connection and removal forces in excess of about 200 lbs. and is further configured to be attached to a further structure at least substantially immovable under application of forces in excess of about 200 lbs.

6. A test pin assembly for the apparatus of claim 1, comprising said test pins mounted on a pin plate in a specific pin configuration corresponding to a specific connector plug for which the apparatus is to be used.

7. The test pin assembly of claim 6, wherein the specific connector plug is at least one of a 400 Hertz aircraft ground power connector plug, a 270 VDC aircraft ground power connector plug and a 28.5 VDC aircraft ground power connector plug.

8. A test pin assembly for use in an aircraft ground power plug force test apparatus, the test apparatus including a support structure defining a positive stop to limit travel of an electrical plug being applied to a set of test pins and a force sensor configured to measure force applied to the set of test pins, the test pin assembly comprising:
   a pin plate connectable with the force sensor so as to transmit force applied to the force sensor; and
   plural test pins mounted on one side of the pin plate, the test pins configured in an arrangement corresponding to the arrangement of pins in a specific aircraft ground power plug to be tested, the test pins further having a length sufficient to extend beyond the positive stop when installed in the test apparatus by a distance substantially equal to the pin length in a corresponding specific aircraft ground power receptacle.

9. The test pin assembly of claim 8, wherein the arrangement of the test pins is in accordance with at least one of the pin arrangement in a receptacle for at least one of a 400 Hertz aircraft ground power connector, a 270 VDC aircraft ground power connector and a 28.5 VDC aircraft ground power connector.

10. A kit for use with an aircraft ground power plug force test apparatus including a support structure defining a positive stop to limit travel of an electrical plug being applied to a set of test pins and a force sensor configured to measure force applied to the set of test pins, comprising:
   at least one said test pin assembly comprising a pin plate connectable with the force sensor so as to transmit force applied to the force sensor, and plural test pins mounted on one side of the pin plate, the test pins configured in an arrangement corresponding to the arrangement of pins in a specific aircraft ground power plug to be tested, the test pins further having a length sufficient to extend beyond the positive stop when installed in the test apparatus by a distance substantially equal to the pin length in a corresponding specific aircraft ground power receptacle; and
   a cover plate for the support structure providing said positive stop, wherein the cover plate includes holes corresponding to the arrangement of the test pins in the test pin assembly to permit the test pins to pass therethrough and extend beyond the cover plate a distance substantially equal to the pin length in the corresponding specific aircraft ground power receptacle.

11. The kit of claim 10, further comprising a pin guide mounted to the cover plate, wherein the pin guide is configured to match the shape and size of a pin guide in the corresponding specific aircraft ground power receptacle.

12. The apparatus of claim 2, for testing connection and removal force in an aircraft ground power connector plug, wherein the test pins extend beyond the cover plate by a distance substantially the same as pin length of an in-service receptacle of the same type.

13. The apparatus of claim 12, for testing connection and removal force in an aircraft ground power connector plug, further comprising a pin guide mounted on the cover plate and surrounding the test pins, wherein the pin guide is configured to match the shape and size of a pin guide in a non-test aircraft ground power connector receptacle.

14. The apparatus of claim 13, for testing connection and removal force in an aircraft ground power connector plug, wherein said support structure is configured to accommodate connection and removal forces in excess of about 200 lbs. and is further configured to be attached to a further structure at least substantially immovable under application of forces in excess of about 200 lbs.

15. A test pin assembly for the apparatus of claim 14, comprising said test pins mounted on a pin plate in a specific pin configuration corresponding to a specific connector plug for which the apparatus is to be used.

16. The test pin assembly of claim 15, wherein the specific connector plug is at least one of a 400 Hertz aircraft ground power connector plug, a 270 VDC aircraft ground power connector plug and a 28.5 VDC aircraft ground power connector plug.

* * * * *